United States Patent
Taguchi et al.

[11] Patent Number: 5,895,527
[45] Date of Patent: Apr. 20, 1999

[54] SINGLE CRYSTAL PULLING APPARATUS

[75] Inventors: Hiroaki Taguchi; Takashi Atami; Hisashi Furuya, all of Tokyo; Masanori Fukui, Akita; Michio Kida, Omiya, all of Japan

[73] Assignees: Mitsubishi Materials Silicon Corporation; Mitsubishi Materials Quartz Corporation; Mitsubishi Materials Corporation, all of Tokyo, Japan

[21] Appl. No.: 08/791,777

[22] Filed: Jan. 29, 1997

[30] Foreign Application Priority Data

Feb. 6, 1996 [JP] Japan ................. 8-020257

[51] Int. Cl.⁶ ............................................. C30B 35/00
[52] U.S. Cl. ..................... 117/200; 65/17.3; 65/144
[58] Field of Search .................. 65/17.3, 144; 117/200, 117/208

[56] References Cited

U.S. PATENT DOCUMENTS

| | | | |
|---|---|---|---|
| 4,416,680 | 11/1983 | Brüning et al. | 65/144 |
| 4,528,763 | 7/1985 | Albrecht | 117/208 |
| 4,632,686 | 12/1986 | Brown et al. | 65/17.3 |
| 5,306,473 | 4/1994 | Nakajima et al. | 117/208 |

FOREIGN PATENT DOCUMENTS

| | | |
|---|---|---|
| 63-303894 | 12/1988 | Japan. |
| 2-133389 | 5/1990 | Japan. |
| 3-5392 | 1/1991 | Japan. |
| 4-12088 | 1/1992 | Japan. |
| 4-305091 | 10/1992 | Japan. |
| 5-85879 | 4/1993 | Japan. |

*Primary Examiner*—Felisa Hiteshew
*Attorney, Agent, or Firm*—Pillsbury Madison & Sutro LLP

[57] ABSTRACT

The invention relates to a single crystal pulling apparatus comprising; an outer crucible 11 positioned inside a chamber (gas tight container) 2, for storing a semiconductor melt 21, and an inner crucible 30 comprising a cylindrical partition body, mounted inside the outer crucible 11 to form a double crucible, and wherein a single crystal of semiconductor 26 is pulled from the semiconductor melt 21 stored inside the inner crucible 30. With this arrangement, the inner crucible 30 is made from quartz and comprises an inside layer A, an outside layer C, and an intermediate layer B which lies between the inside layer A and the outside layer C, and the intermediate layer B is made from quartz with a larger gas bubble content than the quartz which makes up the inside layer A and the outside layer C of the inner crucible 30.

22 Claims, 4 Drawing Sheets

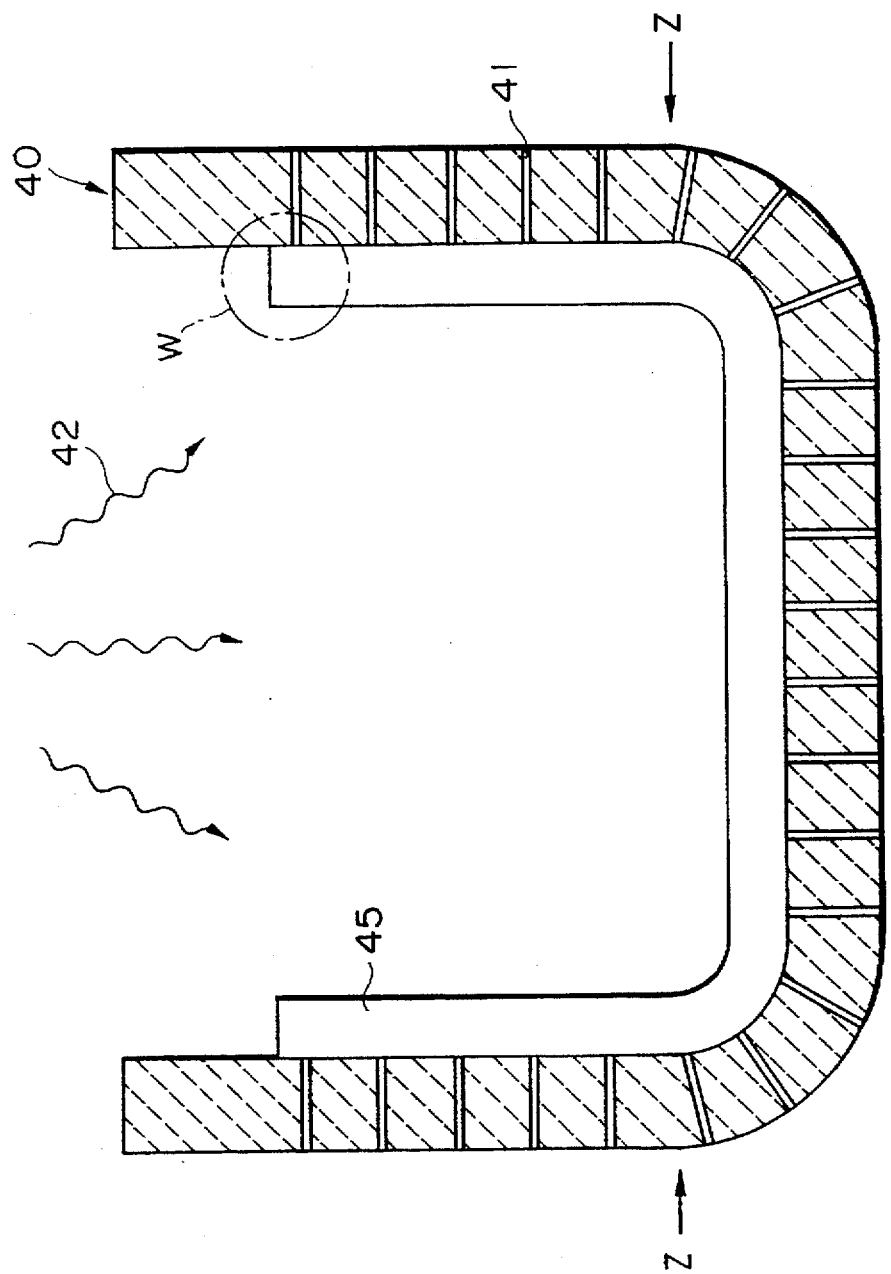

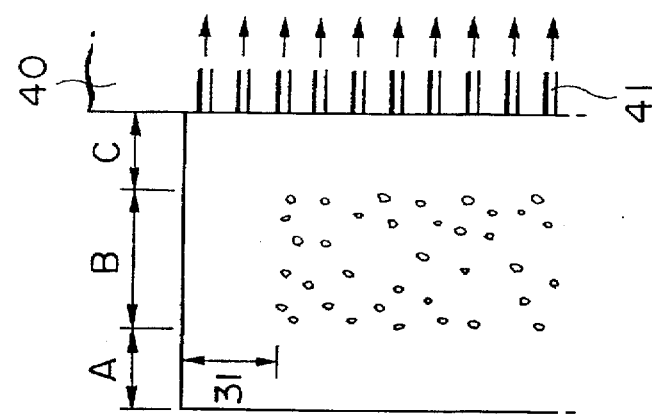
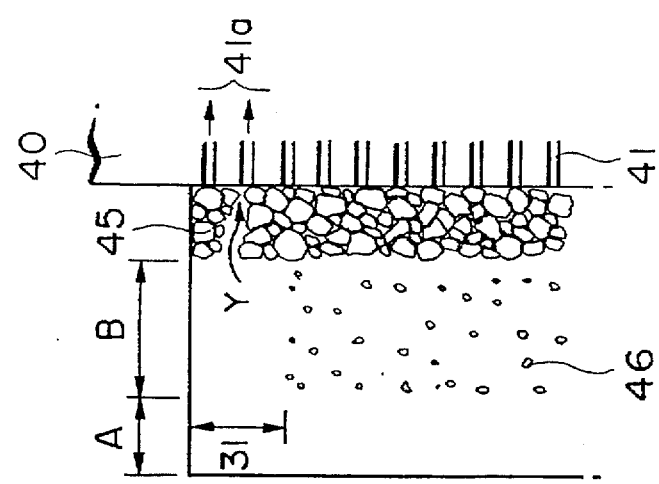
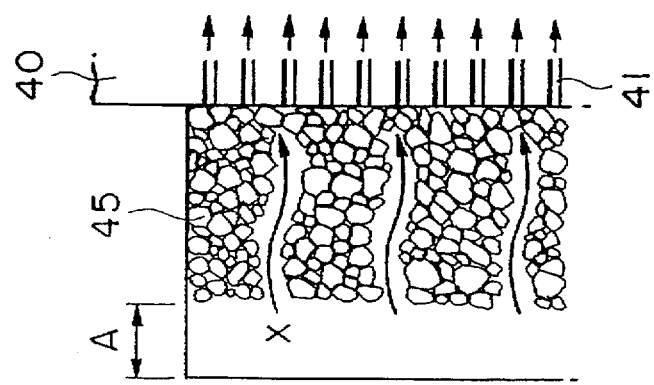

SINGLE CRYSTAL PULLING APPARATUS

FIELD OF THE INVENTION

The present invention relates to a single crystal pulling apparatus for pulling a single crystal of a semiconductor from a semiconductor melt stored in a double crucible.

DESCRIPTION OF THE RELATED ART

The CZ growth technique is an example of one of the currently known methods for growing single crystals of semiconductors such as silicon (Si) or gallium arsenide (GaAs).

Because this CZ growth technique enables simple generation of large diameter, high purity single crystals which are free from dislocation or have extremely low levels of lattice defect, it is widely used in the growing of a variety of semiconductor crystals.

In recent years, the demand for larger diameter, higher purity single crystals with uniform levels of oxygen concentration and impurity concentration, has caused this CZ growth technique to improve in various ways, to meet these demands.

One of the improvements of the aforementioned CZ growth technique which has been proposed, is a continuous magnetic field application CZ technique (hereafter abbreviated as CMCZ technique), which employs a double crucible. Features of this method are that it enables the growth of single crystals with good slip-free ratios and with extremely good control of oxygen concentration levels by external application of a magnetic field to the semiconductor melt inside the crucible, which suppresses convection in the semiconductor melt, and that it enables the simple generation of long single crystals of the semiconducting material by allowing a continuous supply of the source materials from an outer crucible. Consequently, this method is recognized as one of the best for obtaining large diameter, long single crystals of semiconducting materials.

FIG. 4 is a figure from Japanese Patent Application, First Publication, No. Hei-4-305091, showing an example of a single crystal silicon pulling apparatus which employs the CMCZ technique outlined above. With this single crystal pulling apparatus 1, a double crucible 3, a heater 4, and a source material supply tube 5 are positioned inside a hollow gas tight chamber 2, and a magnet 6 is positioned outside this chamber 2.

The double crucible 3 comprises an approximately hemispherical outer crucible 11 made from quartz ($SiO_2$), and an inner crucible 12 made from quartz, which is a cylindrical partition body which is fitted inside the outer crucible 11. The side wall of this inner crucible 12 contains a plurality of connecting apertures 13, which connect between the inner crucible 12 and the outer crucible 11.

This double crucible 3 is mounted on a susceptor 15, which sits on a vertical shaft 14 located centrally at the lower portion of the chamber 2, and can be rotated in a horizontal plane at a specified angular velocity about the axis of the shaft 14. The semiconductor melt (the source material for the generation of single crystals of semiconductor, melted by heating) 21 is stored inside this double crucible 3.

The heater 4 heats and melts the semiconductor source material inside the crucible, and also maintains the temperature of the thus produced semiconductor melt 21. Normally resistance heating is used. The source material supply tube 5 is used to continuously inject a specified volume of semiconductor source material 22, onto the surface of the semiconductor melt between the outer crucible 11 and the inner crucible 12.

The magnet 6 is used to apply, externally, a magnetic field to the semiconductor melt 21 inside the double crucible 3, and to produce Lorentz forces in the semiconductor melt 21, thereby effecting the control of convection within the semiconductor melt 21, the control of oxygen concentration, and the suppression of surface vibration, and so on.

Examples of the source materials 22 which can be supplied through the source material supply tube 5 mentioned above include polysilicon which has been converted to flake form by crushing in a crusher, or polysilicon granules deposited from gaseous source material using thermal decomposition, with further supply, as necessary, of elemental additives known as dopants, such as boron (B) (in the case of production of p-type single crystals of silicon) and phosphorus (P) (in the case of production of n-type single crystals of silicon).

In the case of gallium arsenide (GaAs), the operation is the similar as that outlined above, but in this case, the elemental additive used is either zinc (Zn) or silicon (Si).

With the single crystal pulling apparatus 1 outlined above, a seed crystal 25 is suspended from a pulling shaft 24 located above the inner crucible 12 and over the shaft axis line, and a single crystal of semiconductor 26 is grown at the upper surface of the semiconductor melt 21 around the nucleus of the seed crystal 25.

However, as has been disclosed in Japanese Patent Application, First Publication, No. Sho-63-303894, with this type of single crystal pulling apparatus 1, the growing of single crystals requires that first the polycrystalline source material, such as lumps of polysilicon, be melted, and the resulting semiconductor melt 21 stored inside the outer crucible 11, with the double crucible 3 then being formed by positioning the inner crucible 12 above the outer crucible 11 and then mounting it down onto the outer crucible 11.

The reason that the double crucible 3 is formed after melting of the polycrystalline source material, is that in order to effect complete melting of the polycrystalline source material to obtain the semiconductor melt 21, the temperature of the source material inside the outer crucible 11 needs to be raised, using the heater 4, to a temperature higher than the single crystal growing temperature. On the other hand, if the inner crucible 12 were to be surmounted on the outer crucible 11 prior to the melting stage, large thermal deformation of the inner crucible 12 would occur.

Consequently, by positioning the inner crucible 12 inside the outer crucible 11 after complete melting of the source material and a subsequent lowering in the heat being applied by the heater 4, the high temperatures required in the initial source material melting stage can be avoided, and deformation of the inner crucible 12 suppressed.

Heretofore, for the inner crucible 12, one in which the inside surface is formed from transparent quartz with a relatively low gas bubble content, and the outside surface is formed from translucent quartz with a relatively large gas bubble content has been used.

With this configuration, the high temperatures during the single crystal pulling process result in expansion of the gas bubbles in the outer surface of the inner crucible 12, and the expanding bubbles cause exfoliation of minute chips of quartz. The exfoliated minute quartz chips are undesirable as they separate from the outer surface of the inner crucible 12 and become mixed with the semiconductor melt resulting in a reduction in the slip free ratio of the single crystal produced and an increase in the concentration of impurities.

As a technique for avoiding the problems mentioned above, Japanese Patent Application, First Publication, No. Hei 5-85879 discloses a technique wherein the inner crucible 12 was formed entirely of transparent quartz with a relatively low gas bubble content.

This configuration suppresses the exfoliation of minute quartz chips due to gas bubble expansion during the single crystal pulling process, resulting in an increase in the slip free ratio of the single crystal produced, a decrease in the concentration of impurities and an improvement in the yield of the single crystal of semiconductor.

However, a fault of inner crucibles 12 produced entirely from transparent quartz as described above is that they are relatively weak in comparison to crucibles produced from translucent quartz and are more likely to suffer heat deformation.

The present invention takes the above situation into consideration with the object of providing a single crystal pulling apparatus which offers a stable improvement in the yield of a single crystal of semiconductor by employing an inner crucible which suffers from no reduction in strength and yet is able to suppress the exfoliation of minute quartz chips resulting from gas bubble expansion during operation of the apparatus.

SUMMARY OF THE INVENTION

To meet the aforementioned object, the single crystal pulling apparatus of the present invention comprises a single crystal pulling apparatus wherein a semiconductor melt is stored inside an outer crucible which is positioned inside a gas tight container, and an inner crucible comprising a cylindrical partition body is mounted inside the outer crucible forming a double crucible, and a single crystal of semiconductor is pulled from the semiconductor melt inside the inner crucible, and is characterized in that the inner crucible is made from quartz and comprises an inside layer, an outside layer, and an intermediate layer which lies between the inside layer and the outside layer, and the intermediate layer is made from quartz with a larger gas bubble content than the quartz which makes up the inside layer and the outside layer of the inner crucible.

With this configuration the quartz of the inside layer and the outside layer of the inner crucible, which comes in direct contact with the semiconductor melt, is formed from "transparent quartz" with a relatively low gas bubble content, and so exfoliation of minute quartz chips resulting from gas bubble expansion during operation of the apparatus is prevented. In addition, the intermediate layer which does not contact the semiconductor melt is formed from "translucent quartz" with a relatively large gas bubble content, thus ensuring the strength of the inner crucible.

With the present invention, the term "gas bubble content" is understood to mean as the volume ratio of the gas bubbles contained within the quartz. The measurement of this gas bubble content is normally conducted by image processing techniques. In those instances where destructive measurement is possible specific gravity measurements can also be used.

The cross-sectional surface area of the intermediate layer of the inner crucible should preferably be no less than 40% and no more than 80% of the total cross-sectional area of the inner crucible, and the thickness of the inside layer should be at least 0.5 mm.

Furthermore, the quartz which forms the inside layer and the outside layer of the inner crucible should preferably have a gas bubble content of no more than 0.2%, with a value of less than 0.06% being even more preferable.

Moreover, it is preferable if the gas bubbles contained within the quartz which forms the inside layer and the outside layer of the inner crucible have an average diameter of no more than 40 μm.

In addition, the quartz which forms the intermediate layer of the inner crucible should preferably have a gas bubble content of no less than 0.4% and no more than 2.0%.

Furthermore, it is preferable if just the bottom edge portion of the intermediate layer of the inner crucible is formed from the same type of quartz as that used to form the inside layer and the outside layer of the inner crucible.

BRIEF DESCRIPTION OF THE DRAWINGS

FIG. 2 is a cross-sectional diagram showing one stage in the manufacture of the inner crucible shown in FIG. 1;

FIGS. 3A–3C are cross-sectional view showing, in order, the various stages in the production of the inner crucible shown in FIG. 1, with each view being an enlargement of the area W shown in FIG. 2.

DESCRIPTION OF THE PREFERRED EMBODIMENTS

Below is a description of the preferred embodiments of the present invention, with reference to the drawings.

Figure 1:
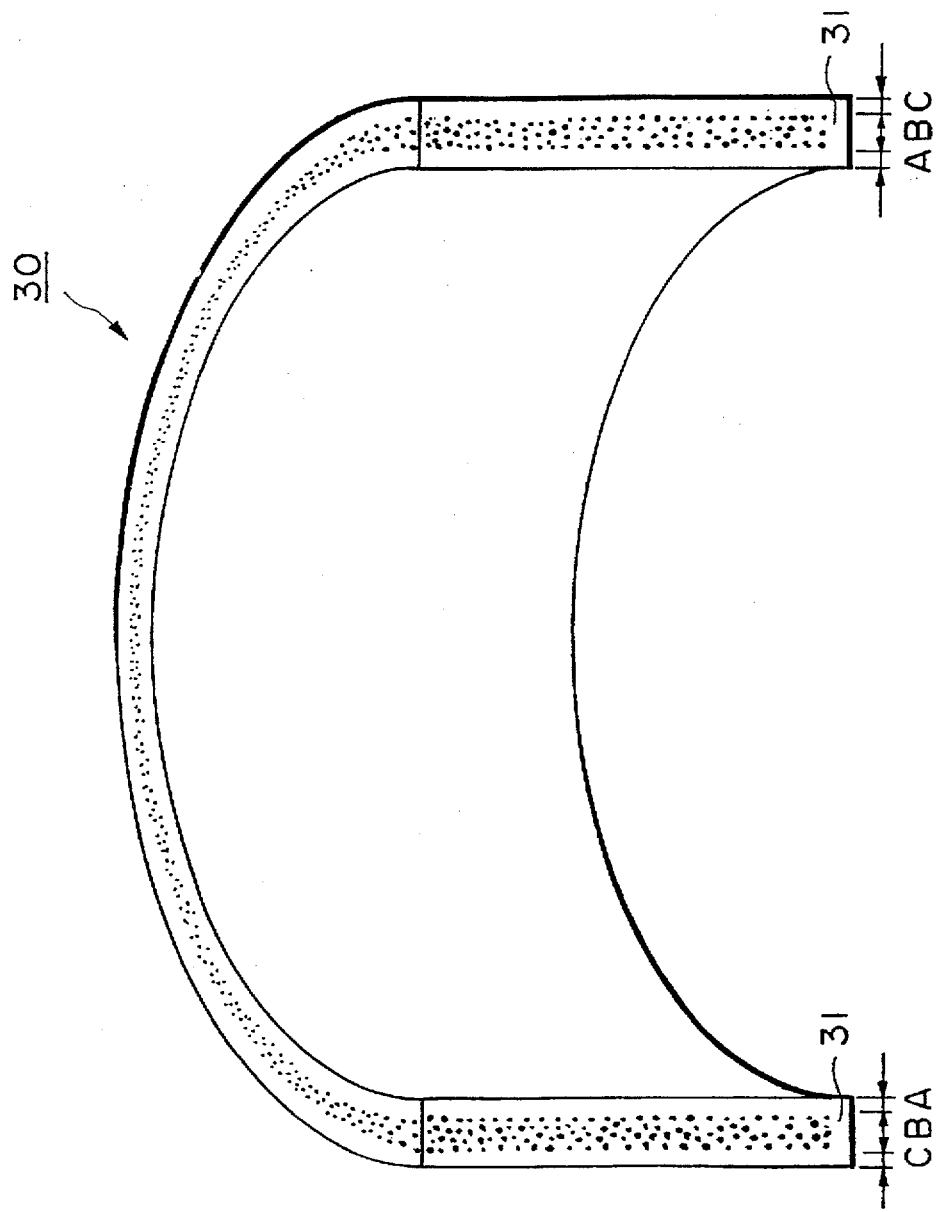
FIG. 1 is a perspective view showing half of a preferred embodiment of an inner crucible used in a single crystal pulling apparatus of the present invention.

A preferred embodiment of an inner crucible used in a single crystal pulling apparatus of the present invention is shown in FIG. 1.

Figure 4:
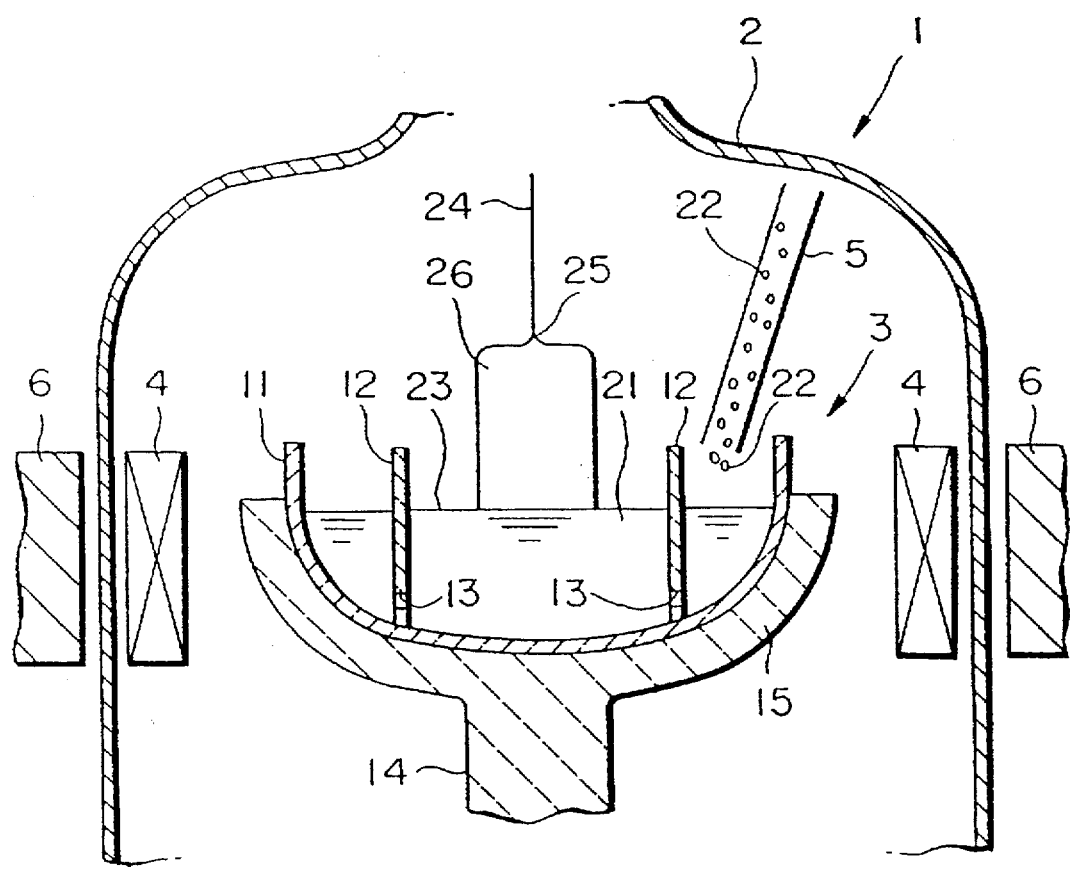
FIG. 4 is a cross-sectional view showing an example of a single crystal pulling apparatus.

This inner crucible 30 is used in place of a currently employed inner crucible 12 in, for example, the single crystal pulling apparatus 1 shown in FIG. 4 which employs the CMCZ technique.

The inner crucible 30 of this embodiment is crucially different from current inner crucibles 12. As shown in FIG. 1 it comprises:

(a) an inside layer A which contains an inner surface which is exposed to direct contact with a semiconductor melt 21, (b) an outside layer C which contains an outer surface which is also exposed to direct contact with the semiconductor melt 21, (c) an intermediate layer B which constitutes an unexposed portion which lies between the inside layer A and the outside layer C, and which is not exposed directly to contact with the semiconductor melt 21, and (d) a bottom edge portion 31 which contains a bottom edge surface which is exposed to direct contact with the semiconductor melt 21. The quartz which constitutes the inside layer A, the outside layer C and the bottom edge portion 31 is formed from "transparent quartz" with a relatively low gas bubble content. The intermediate layer B, with the exception of the bottom edge portion 31, is formed from "translucent quartz" with a relatively large gas bubble content.

In similarity with currently employed inner crucibles 12, the overall shape of the inner crucible is cylindrical, and the inner crucible contains a plurality of connecting apertures similar to the connecting apertures 13.

In the case of the present invention the portions of the inner crucible in the vicinity of the connecting apertures which come in contact with the semiconductor melt 21 are formed from transparent quartz.

Next is an explanation of the production method used for an inner crucible 30 of the above configuration, with reference to FIG. 2 and FIGS. 3A–3C.

In FIG. 2 numeral 40 refers to an approximately bowl shaped rotation mold made of graphite which is positioned inside an arc furnace. This rotation mold 40 contains a plurality of exhaust apertures 41 which allow gas to be evacuated from the inner surface of the rotation mold 40 to the outside. These exhaust apertures 41 are connected to an exhaust apparatus which is not shown in the figure, and each of exhaust apertures 41 is configured to be evacuated independently.

The arc furnace is set up so that the radiation 42 from an arc flame is directed towards the inner surface of the rotation mold 40 resulting in heating of the mold.

In the production of the inner crucible 30, first a predetermined thickness of a powdered quartz source material 45 is positioned on the inner surface of the rotation mold 40.

Next, heat is applied and the powdered quartz source material 45 is melted and vitrified. In this process, the melting occurs first at the inner surface of the deposited powdered quartz source material 45.

Formation of the inside layer A

First, evacuation is conducted from all of the exhaust apertures 41 as shown in FIG. 3A, and then heat is applied. As a result, any atmospheric gas located within the now melting inner layer of powdered quartz source material 45 passes out through the gaps in the powdered quartz source material 45 as shown by the arrows X and is evacuated, thus forming an inside layer A of transparent quartz which has a low gas bubble content.

Formation of the intermediate layer B

Next heat is applied, and evacuation is continued from the upper exhaust apertures 41a which correspond to the bottom edge portion 31, and evacuation is halted from all the remaining exhaust apertures 41 which correspond to the intermediate layer B. As a result, melting in the region of the intermediate layer occurs without complete evacuation of any atmospheric gas located within the powdered quartz source material 45, and so the atmospheric gas is retained in the layer as gas bubbles 46, thus forming an intermediate layer B of translucent quartz which contains a comparatively large amount of large gas bubbles 46.

On the other hand, in the region corresponding to the bottom edge portion 31, evacuation is conducted from the upper exhaust apertures 41a, and so in the same way as was described for the inside layer A, any atmospheric gas located within the powdered quartz source material 45 passes out through the gaps in the powdered quartz source material 45 as shown by the arrow Y and is evacuated, thus forming a region of transparent quartz which has a low gas bubble content.

Formation of the outside layer C

Next, evacuation is conducted from all of the exhaust apertures 41 as shown in FIG. 3C, and heat is applied. As a result, any atmospheric gas located within the now melting outer layer of powdered quartz source material 45 is evacuated, thus forming an outside layer C of transparent quartz which has a low gas bubble content.

Finally, the quartz crucible is cut along the line Z—Z shown in FIG. 2.

The inner crucible 30 can be produced using the above procedure.

However, when using the inner crucible, it is noted that the crucible is inverted so that the region of transparent quartz becomes the bottom edge portion 31 of the inner crucible 30.

Next is a description of the method for growing a single crystal of silicon semiconductor using a single crystal pulling apparatus of the present invention, with reference to FIG. 4. However, it should be noted that with the present embodiment the inner crucible 12 shown in FIG. 4 has been replaced by the inner crucible 30 described above.

Initial source material melting process

First, a predetermined amount of a polycrystalline source material such as lumps of polysilicon is placed in the outer crucible 11, and the chamber (gas tight container) 2 evacuated using a vacuum pump, or the like, to produce a vacuum. Next, an inert gas such as argon (Ar) is introduced into the chamber 2, and while the outer crucible 11 is rotated at a predetermined angular velocity by rotating the shaft 14 in a horizontal plane about its axis at a predetermined angular velocity, the heater 4 is activated, and the polycrystalline source material inside the outer crucible 11 heated to a temperature exceeding the single crystal growing temperature to melt the source material completely.

Double crucible formation step

After the source material has melted completely, the heat being applied by the heater 4 is reduced slightly, and the inner crucible 30 (which is used in place of the inner crucible 12 in FIG. 4) is lowered into the semiconductor melt 21 and surmounted onto the outer crucible 11 concentric therewith, forming a double crucible 3.

Single crystal growing process

Following formation of the double crucible 3, an electric current is passed through a magnet 6, applying a magnetic field of predetermined strength, the electrical power to the heater 4 is adjusted so as to maintain the surface temperature in the vicinity of the middle area 23 of the semiconductor melt 21 at the single crystal growing temperature, and after the seed crystal 25, which is suspended from the pulling shaft 24, is put in contact with the semiconductor melt 21 a single crystal of semiconductor is grown around a nucleus of the seed crystal 25. In this case, following preparation of a seed crystal which is free of dislocation, the diameter of the single crystal is gradually increased to produce a single crystal of semiconductor 26 of specified diameter.

With this single crystal growing process, granulated silicon source material 22 is added continuously at a rate which is proportional to the growth rate (pull rate) of the single crystal of semiconductor 26, and this added source material 22 melts in the outer crucible 11 and passes through connecting apertures, to be supplied continuously to the inside of the inner crucible 30.

Single crystals of semiconductor can thus be grown in the manner described.

Because the gas bubble content of the transparent quartz which forms the inside layer A, the outside layer C and the bottom edge portion 31 is relatively low, use of the aforementioned inner crucible 30 enables suppression of the exfoliation of minute quartz chips from the inner surface, the outer surface and the bottom edge surface of the inner crucible 30 due to gas bubble expansion, as it is unlikely that gas bubble expansion will occur in the inside layer A, the outside layer C and the bottom edge portion 31 during operation of the apparatus.

Furthermore, because the intermediate layer B is formed from translucent quartz in which the gas bubble content is relatively large, the strength of the entire inner crucible 30 is ensured.

Consequently, by enabling suppression of the exfoliation of minute quartz chips due to gas bubble expansion during the operation of the apparatus and yet generating no reduction in the strength of the inner crucible 30, the present invention enables a stable improvement in the yield of a single crystal of semiconductor.

Furthermore, because the bottom edge portion 31 of the inner crucible 30 is formed from transparent quartz, the exfoliation of minute quartz chips from the bottom edge of the inner crucible 30 during formation of the double crucible is suppressed.

In the above embodiment, it is preferable if the cross-sectional area of the intermediate layer B is at least 40%, and no more than 80% of the total cross-sectional area of the inner crucible 30.

Moreover, it is preferable if the thickness of the inside layer A is at least 0.5 mm.

The reason for this requirement is that if the area of the intermediate layer B is at least 40% of the total cross-sectional area, a high strength portion of the inner crucible is ensured. Furthermore, if the area of the intermediate layer B is no more than 80% of the total cross-sectional area and in particular the thickness of the inside layer A is at least 0.5 mm, then from a practical standpoint the thickness of the inside layer A and the outside layer C which cover the intermediate layer B can be ensured, and so even if gas bubble expansion occurs within the intermediate layer B it is contained within the intermediate layer B, and any subsequent influence on the semiconductor melt 21 can be prevented.

In the above embodiment, the quartz which forms the inside layer A, the outside layer C, and the bottom edge portion 31 should preferably have a gas bubble content of no more than 0.2%, with a value of less than 0.06% being even more desirable. The reason for this requirement is that if the gas bubble content is within this preferred range, the frequency of occurrence of gas bubble expansion within the inside layer A, the outside layer C, and the bottom edge portion 31 during operation of the apparatus can be reduced to a level where it poses no practical problems, thus enabling an improvement in the slip-free ratio of the single crystal of silicon produced. This advantage is explained further in the description of the experimental examples below.

Furthermore, in the above embodiment it is preferable if any gas bubbles contained within the quartz which forms the inside layer A, the outside layer C, and the bottom edge portion 31 have an average diameter of no more than 40 µm. The reason for this requirement is that provided the average diameter of any gas bubbles is no more than 40 µm, then even if gas bubble expansion occurs within the exposed portion, the probability of exfoliation of minute quartz chips occurring is reduced to a level where it poses no practical problems.

In the above embodiment, the quartz which forms the intermediate layer B should preferably have a gas bubble content of no less than 0.4% and no more than 2.0%. The reason for this requirement is that provided the gas bubble content is no less than 0.4% and no more than 2.0%, the strength of this portion of quartz can be maintained at a level above a specified strength.

EXPERIMENTAL EXAMPLES

Below is an explanation of the relationship between the gas bubble content of the quartz of the surface portions (this title is used below to refer to "the inside layer A, the outside layer C and the bottom edge portion 31") and the slip-free ratio of the single crystal, based on experimental examples of single crystals of silicon.

EXPERIMENTAL EXAMPLES 1, 2

Single crystals of silicon were grown using the method detailed in the embodiment described above and with the quartz gas bubble content of the surface portion set at a level of no more than 0.06%.

The gas bubble content of each of the portions and the slip-free ratio of each of the single crystals of silicon produced are shown in Table 1.

As shown in Table 1, single crystals of silicon with remarkably high slip-free ratios were obtained.

EXPERIMENTAL EXAMPLES 3, 4

Single crystals of silicon were grown using the method detailed in the embodiment described above and with the quartz gas bubble content of the surface portion set at a level between 0.06% and 0.20%. The gas bubble content of each of the portions and the slip-free ratio of each of the single crystals of silicon produced are shown in Table 1.

As shown in Table 1, although not reaching the levels of experimental examples 1 and 2, single crystals of silicon with very high slip-free ratios were obtained.

COMPARATIVE EXAMPLES 1, 2

Single crystals of silicon were grown using the method detailed in the embodiment described above and with the quartz gas bubble content of the surface portion set at a level greater than 0.20%. The gas bubble content of each of the portions and the slip-free ratio of each of the single crystal of silicon produced are shown in Table 1.

As shown in Table 1, single crystal of silicon which displayed distinctly lower slip-free ratios than those of the experimental examples 1–4 were obtained.

TABLE 1

|  | Experimental Examples | | | | Comparative examples | |
| --- | --- | --- | --- | --- | --- | --- |
|  | 1 | 2 | 3 | 4 | 1 | 2 |
| Gas bubble content (%) | | | | | | |
| Inside Layer | 0.03 | 0.05 | 0.14 | 0.17 | 0.23 | 0.27 |
| Outside Layer | 0.03 | 0.06 | 0.11 | 0.20 | 0.28 | 0.35 |
| Bottom edge portion | 0.03 | 0.06 | 0.13 | 0.18 | 0.22 | 0.37 |
| Slip free ratio of single crystal (%) | 97 | 98 | 87 | 82 | 56 | 38 |

Thus, it was shown unquestionably that a clear relationship exists between the gas bubble content of the various portions and the slip-free ratio of the single crystals of silicon produced, and that the slip-free ratio of the single crystal can be improved by ensuring that the gas bubble content of the quartz of the surface portion, comprising the inside layer A, the outside layer C, and the bottom edge portion 31, is maintained at a level of no more than 0.2%, as in experimental examples 3 and 4.

Furthermore, by ensuring the gas bubble content of the quartz of the surface portion is set at a level of no more than 0.06% as in experimental examples 1 and 2, the slip-free ratio of the single crystal can be improved markedly.

The results above reflect the fact that the frequency of occurrence of gas bubble expansion in the quartz of the surface portion varies with the gas bubble content of the quartz of the surface portion.

Moreover, in the embodiment described above, the growing of single crystals of silicon was outlined in the examples, but the single crystal pulling apparatus of the present invention is not limited to only this medium, and can also be used in the growing of other single crystals such as gallium arsenide.

Furthermore in the examples given, the inside layer A, the outside layer C, and the bottom edge portion 31 were all formed from "transparent quartz", but it is also possible to have only the inside layer A and the outside layer C formed from "transparent quartz".

Furthermore in the above, from the standpoint of ensuring the thickness of the transparent quartz portion with a low gas bubble content which covers the intermediate layer B, it is preferable if the thickness of the outside layer C is at least 0.5 mm.

As explained above, the single crystal pulling apparatus of the present invention produces the following effects.

A characteristic of the present invention is that the quartz of the inside layer and outside layer, which come in direct contact with the semiconductor melt, are formed from transparent quartz with a relatively low gas bubble content, and so exfoliation of minute quartz chips resulting from gas bubble expansion during operation of the apparatus can be suppressed. In addition, the intermediate layer which does not come into direct contact with the semiconductor melt is formed from translucent quartz with a relatively high gas bubble content, and so this intermediate layer ensures the overall strength of the inner crucible. Consequently, a stable improvement in the yield of the single crystal of semiconductor can be achieved by suppressing the exfoliation of minute quartz chips resulting from gas bubble expansion during operation of the apparatus without reducing the strength of the inner crucible.

Another characteristic of the present invention is that, because the cross-sectional area of the intermediate layer formed from translucent quartz is at least 40% of the total cross-sectional area of the inner crucible, a portion of high strength is ensured. At the same time, because the area of the intermediate layer is no more than 80% of the total cross-sectional area and the thickness of the inside layer is at least 0.5 mm, the thickness of the transparent quartz portion with low gas bubble content which covers the intermediate layer can be ensured, and so even if gas bubble expansion occurs within the portion formed from translucent quartz, it exerts no influence on the outer portions. Thus, a stable improvement in the yield of the single crystal of semiconductor can be achieved by suppressing the exfoliation of minute quartz chips resulting from gas bubble expansion during operation of the apparatus without reducing the strength of the inner crucible.

A further characteristic of the present invention is that, because the gas bubble content of the quartz which forms the inside layer and outside layer of the inner crucible is no more than 0.2%, the frequency of occurrence of gas bubble expansion within the quartz of the inside layer and the outside layer, which are exposed to the semiconductor melt during operation of the apparatus, can be reduced to a level where it poses no practical problems, thus enabling an improvement in the slip-free ratio of the single crystal of silicon.

Another characteristic of the present invention is that, if the gas bubble content of the quartz which forms the surface portion of the inner crucible is no more than 0.06%, the frequency of occurrence of gas bubble expansion within the quartz of the inside layer and the outside layer, which are exposed to the semiconductor melt during operation of the apparatus, can be reduced even further thus enabling an even greater improvement in the slip-free ratio of the single crystal of silicon.

Another characteristic of the present invention is that, because the average diameter of any gas bubble contained within the quartz forming the inside layer and outside layer of the inner crucible is no more than 40 µm, then even if gas bubble expansion occurs within the quartz of the inside layer and the outside layer, which are exposed to the semiconductor melt during operation of the apparatus, the probability of exfoliation of minute quartz chips occurring is reduced to a level where it poses no practical problems.

A further characteristic of the present invention is that, because the gas bubble content of the quartz which forms the intermediate layer of the inner crucible is no less than 0.2% and no more than 2.0%, the strength of this portion of quartz can be maintained at a level above a specified strength.

A further characteristic of the present invention is that, because the bottom edge portion of the inner crucible is formed from "transparent quartz" with a relatively low gas bubble content, exfoliation of minute quartz chips from the bottom edge portion due to gas bubble expansion is prevented. Furthermore, if the gas bubble content of the bottom edge portion of the inner crucible is no more than 0.2% and preferably no more than 0.06% the frequency of occurrence of gas bubble expansion within the bottom edge portion can be reduced sufficiently. Furthermore, if the average diameter of any gas bubble contained within the bottom edge portion is no more than 40 µm, then even if gas bubble expansion occurs within the bottom edge portion the probability of exfoliation of minute quartz chips occurring is reduced to a level where it poses no practical problems.

Finally, the present application claims the priority of Japanese Patent Application No. Hei 8-20257, filed Feb. 6, 1996, which is herein incorporated by reference.

What is claimed is:

1. A single crystal pulling apparatus, comprising:
    an outer crucible positioned inside a gas tight container, for storing a semiconductor melt, and
    an inner crucible comprising a cylindrical partition body mounted inside the outer crucible to form a double crucible, said inner crucible partitioning the semiconductor melt stored in said outer crucible, wherein
    a single crystal of semiconductor is pulled from the semiconductor melt stored inside said inner crucible, wherein
    said inner crucible is made from quartz and comprises an inside layer, an outside layer, and an intermediate layer, which lies between the inside layer and the outside layer, and said intermediate layer includes quartz with a larger gas bubble content as compared to the quartz which makes up the inside layer and the outside layer of said inner crucible.

2. A single crystal pulling apparatus according to claim 1, wherein a cross-sectional surface area of said intermediate layer of said inner crucible is no less than 40% and no more than 80% of a total cross-sectional area of said inner crucible, and a thickness of said inside layer is at least 0.5 mm.

3. A single crystal pulling apparatus according to claim 2, wherein the gas bubbles contained within the quartz which forms the inside layer and the outside layer of said inner crucible have an average diameter of no more than 40 µm.

4. A single crystal pulling apparatus according to claim 2, wherein the quartz which forms the intermediate layer of said inner crucible has a gas bubble content of no less than 0.4% and no more than 2.0%.

5. A single crystal pulling apparatus according to claim 2, wherein just a bottom edge portion of the intermediate layer of said inner crucible is formed from quartz with a smaller gas bubble content than quartz which makes up the remainder of the intermediate layer.

6. A single crystal pulling apparatus according to claim 2, wherein the quartz which forms the inside layer and the outside layer of said inner crucible has a gas bubble content of no more than 0.2%.

7. A single crystal pulling apparatus according to claim 6, wherein the gas bubbles contained within the quartz which forms the inside layer and the outside layer of said inner crucible have an average diameter of no more than 40 µm.

8. A single crystal pulling apparatus according to claim 6, wherein the quartz which forms the intermediate layer of said inner crucible has a gas bubble content of no less than 0.4% and no more than 2.0%.

9. A single crystal pulling apparatus according to claim 6, wherein just a bottom edge portion of the intermediate layer of said inner crucible is formed from quartz with a smaller gas bubble content than quartz which makes up the remainder of the intermediate layer.

10. A single crystal pulling apparatus according to claim 6, wherein the quartz which forms the inside layer and the outside layer of said inner crucible has a gas bubble content of no more than 0.06%.

11. A single crystal pulling apparatus according to claim 10, wherein the gas bubbles contained within the quartz which forms the inside layer and the outside layer of said inner crucible have an average diameter of no more than 40 µm.

12. A single crystal pulling apparatus according to claim 1, wherein the quartz which forms the inside layer and the outside layer of said inner crucible has a gas bubble content of no more than 0.2%.

13. A single crystal pulling apparatus according to claim 12, wherein the quartz which forms the inside layer and the outside layer of said inner crucible has a gas bubble content of no more than 0.06%.

14. A single crystal pulling apparatus according to claim 13, wherein the gas bubbles contained within the quartz which forms the inside layer and the outside layer of said inner crucible have an average diameter of no more than 40 µm.

15. A single crystal pulling apparatus according to claim 12, wherein the gas bubbles contained within the quartz which forms the inside layer and the outside layer of said inner crucible have an average diameter of no more than 40 µm.

16. A single crystal pulling apparatus according to claim 12, wherein the quartz which forms the intermediate layer of said inner crucible has a gas bubble content of no less than 0.4% and no more than 2.0%.

17. A single crystal pulling apparatus according to claim 12, wherein just a bottom edge portion of the intermediate layer of said inner crucible is formed from quartz with a smaller gas bubble content than quartz which makes up the remainder of the intermediate layer.

18. A single crystal pulling apparatus according to claim 1, wherein the gas bubbles contained within the quartz which forms the inside layer and the outside layer of said inner crucible have an average diameter of no more than 40 µm.

19. A single crystal pulling apparatus according to claim 1, wherein the quartz which forms the intermediate layer of said inner crucible has a gas bubble content of no less than 0.4% and no more than 2.0%.

20. A single crystal pulling apparatus according to claim 1, wherein just a bottom edge portion of the intermediate layer of said inner crucible is formed from quartz with a smaller gas bubble content than quartz which makes up the remainder of the intermediate layer.

21. A single crystal pulling apparatus according to claim 1, wherein the inner crucible contains a plurality of connecting apertures, and portions of the inner crucible in the vicinity of the connecting apertures are made from quartz with a smaller gas bubble content than quartz included in the intermediate layer.

22. A single crystal pulling apparatus according to claim 1, wherein quartz which makes up the inside layer and the outside layer of said inner crucible is substantially transparent, and quartz which has a larger gas bubble content as compared to quartz which makes up the inside layer and the outside layer of said inner crucible is substantially opaque.

* * * * *